US008338281B2

(12) United States Patent
Choi et al.

(10) Patent No.: US 8,338,281 B2
(45) Date of Patent: Dec. 25, 2012

(54) METHOD FOR FABRICATING SEMICONDUCTOR DEVICE

(75) Inventors: Kee-Joon Choi, Chungcheongbuk-do (KR); Il-Kyoo Park, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 35 days.

(21) Appl. No.: 12/472,723

(22) Filed: May 27, 2009

(65) Prior Publication Data

US 2010/0035388 A1 Feb. 11, 2010

(51) Int. Cl.
*H01L 21/265* (2006.01)

(52) U.S. Cl. ................ 438/527; 438/299; 257/E21.346; 257/E21.417

(58) Field of Classification Search .................. 438/197, 438/299, 510, 514, 527; 257/E21.346, E21.409, 257/E29.242, 335, E21.261, E21.256, E21.257, 257/E21.417, E21.418

See application file for complete search history.

(56) References Cited

U.S. PATENT DOCUMENTS 4,038,107 A * 7/1977 Marr et al. .................... 438/527
4,145,233 A * 3/1979 Sefick et al. .................. 438/289
4,485,390 A * 11/1984 Jones et al. ................... 257/404
5,198,692 A * 3/1993 Momose ....................... 257/591
5,593,904 A * 1/1997 Nishizaka et al. ............ 438/234
5,795,793 A * 8/1998 Kinzer .......................... 438/307
5,811,358 A * 9/1998 Tseng et al. .................. 438/725
5,866,446 A * 2/1999 Inoh ............................. 438/202
5,981,343 A * 11/1999 Magri et al. .................. 438/268
6,117,735 A * 9/2000 Ueno ............................ 438/268
6,133,607 A * 10/2000 Funaki et al. ................ 257/343
6,376,875 B1 * 4/2002 Kakoschke et al. ........... 257/315
6,392,275 B1 * 5/2002 Jang ............................. 257/343
6,455,904 B1 * 9/2002 Noda ............................ 257/393
6,573,534 B1 * 6/2003 Kumar et al. .................. 257/77
6,642,148 B1 * 11/2003 Ghandehari et al. .......... 438/694
6,873,021 B1 * 3/2005 Mitros et al. .................. 257/409
6,927,452 B2 * 8/2005 Shin et al. ..................... 257/335
6,958,515 B2 10/2005 Hower et al.
7,074,643 B2 * 7/2006 Ryu .............................. 438/105
8,207,031 B2 * 6/2012 Ellmers et al. ................ 438/199
2002/0048837 A1 * 4/2002 Burke et al. .................... 438/48
2002/0098637 A1 * 7/2002 Hossain et al. ............... 438/200
2002/0139773 A1 * 10/2002 Gabriel et al. .................. 216/62
2002/0139992 A1 * 10/2002 Kumar et al. ................. 257/134
2003/0001206 A1 * 1/2003 Negoro et al. ................ 257/336
2004/0051148 A1 * 3/2004 Johnson et al. ............... 257/378
2004/0115874 A1 * 6/2004 Amon et al. .................. 438/200

(Continued)

FOREIGN PATENT DOCUMENTS

JP 55-115328 9/1980

(Continued)

*Primary Examiner* — Jarrett Stark
*Assistant Examiner* — Michele Fan
(74) *Attorney, Agent, or Firm* — Morgan, Lewis & Bockius LLP

(57) ABSTRACT

Provided is a method for fabricating a semiconductor device. The method includes: forming a photoresist pattern having a first opening over a substrate; forming a first impurity region inside the substrate exposed to the first opening; partially etching the photoresist pattern by a plasma ashing process using oxygen ($O_2$) gas to form a second opening having a width broader than that of the first opening; and forming a second impurity region inside the substrate exposed through the second opening, wherein the width of the second opening varies according to a plasma ashing time.

8 Claims, 4 Drawing Sheets

214
212
204
208
210
202
200

U.S. PATENT DOCUMENTS

2005/0062125 A1* 3/2005 Kitaguchi .................... 257/492
2005/0112822 A1* 5/2005 Litwin ......................... 438/270
2005/0127439 A1* 6/2005 Matsuzaki et al. ............ 257/341
2006/0027863 A1* 2/2006 Kumagai et al. .............. 257/335
2006/0131619 A1* 6/2006 Wu .............................. 257/260
2007/0054451 A1* 3/2007 Tanaka .......................... 438/257
2008/0157187 A1* 7/2008 Qian et al. .................... 257/324
2008/0166849 A1* 7/2008 Yang et al. .................... 438/305
2009/0090978 A1* 4/2009 Harada et al. ................. 257/392
2009/0212360 A1* 8/2009 Knaipp ......................... 257/335
2010/0006847 A1* 1/2010 Hu et al. ......................... 257/66
2010/0025756 A1* 2/2010 Fu et al. ........................ 257/328
2010/0163984 A1* 7/2010 Kim .............................. 257/337
2010/0181616 A1* 7/2010 Takehiro ....................... 257/336
2010/0187606 A1* 7/2010 Kobayashi et al. ........... 257/338
2011/0241114 A1* 10/2011 Su et al. ........................ 257/343

FOREIGN PATENT DOCUMENTS

JP 62061353 A * 3/1987
KR 2000-0076922 12/2000
KR 10-2008-0056577 6/2008

* cited by examiner

METHOD FOR FABRICATING SEMICONDUCTOR DEVICE

CROSS-REFERENCE TO RELATED APPLICATIONS

The present invention claims priority of Korean Patent Application No. 10-2008-0076452, filed on Aug. 5, 2008, which is incorporated herein by reference.

BACKGROUND OF THE INVENTION

1. Field of the Invention

The present invention relates to a method for fabricating a semiconductor device; and, more particularly, a method for forming a channel of a lateral double diffused MOSFET (LDMOS).

2. Description of Related Art

Recently, a modular system on chip (MSOC) including a modular bipolar complementary metal oxide semiconductor-discrete metal oxide semiconductor (MBCD) single integrated circuit has been used for an integrated circuit of a smart cards to embody telecommunication system for high frequency and high internal pressure such as automotive power integrated circuits and a direct current to direct current (DC/DC) converter with an increasing demand.

A lateral double diffused MOSFET (LDMOS) is mainly used in a Power Integrated Circuit (PIC) as an essential device of a bipolar CMOS DMOS (BCD) process. Since the LDMOS has high input impedance in comparison with a bipolar transistor, a power gain is large and a gate driver circuit is very simple. Also, since a device is a unipolar device, there is no time delay occurring due to accumulation or recombination by a few carrier during a turn-off time.

FIGS. 1A to 1C are cross-sectional views describing a conventional LDMOS fabricating method. Herein, a method for fabricating the LDMOS having an n-channel will be described as an example.

As shown in FIG. 1A, an n-well 102 is formed over a p-type semiconductor substrate 100 doped at a relatively high density. The n-well 102 functions as a drain region.

Subsequently, a field insulation layer 104 is formed over the semiconductor substrate 100. Subsequently, a photoresist pattern 106 is formed over the semiconductor substrate 100. Subsequently, an impurity region 108 is formed inside the semiconductor substrate 100 using the photoresist pattern 106 as a mask. At this time, impurities having different conductive types and diffusion forces are simultaneously implanted to realize a source region 110 and a channel region 112 of FIG. 1B in the impurity region 108 at the same time. For example, arsenic (As), which is a material of group V in a periodic table, for realizing the n-type source region 110 in the impurity region 108 and boron (B), which is a material of group III in the periodic table, for realizing the p-type channel region 112 are simultaneously implanted.

As shown in FIG. 1B, the boron (B) implanted in the impurity region 108 is diffused into the n-well 102 through a diffusion process. At this time, the arsenic (As) of a low diffusion level in comparison with the boron (B) is not diffused and remains in the impurity region 108. Only the boron (B) of the high diffusion level is diffused into the n-well 102. Accordingly, the arsenic (As) remains in the impurity region 108 to form the source region 110 and the channel region 112 is formed to enclose the source region 110 with the boron (B) diffused from the impurity region 108.

As shown in FIG. 1C, a gate electrode including a gate insulation layer 114 and a gate conductive layer 116 is formed over the semiconductor substrate 100. At this time, a part of the gate electrode is overlapped with the channel region 112.

However, following is a problem associated with the conventional LDMOS fabricating method.

As described in FIG. 1B, since the self-aligned channel region 112 is formed over the source region 110 by using a diffusion level difference between the impurities implanted in the impurity region 108 in the conventional technology, a profile of the channel region 112, i.e., a channel length, can be uniformly maintained. However, since the channel length is determined according to the diffusion process, a device is not realized by using the same process when the channel length is changed. A diffusion process time should be varied to change the channel length. At this time, a device characteristic such as threshold voltage or breakdown voltage may be changed.

SUMMARY OF THE INVENTION

An embodiment of the present invention is directed to providing a method for fabricating a semiconductor device which can freely change a profile required by a device while minimizing change of a device characteristic in the semiconductor device fabricating method including an ion implantation process for realizing self-alignment of two impurity regions.

The objects of the present invention are not limited to the above-mentioned ones. Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an aspect of the present invention, there is provided a method for fabricating a semiconductor device, including: forming a photoresist pattern having a first opening over a substrate; forming a first impurity region inside the substrate exposed to the first opening; partially etching the photoresist pattern by a plasma ashing process using oxygen ($O_2$) gas to form a second opening having a width broader than that of the first opening; and forming a second impurity region inside the substrate exposed through the second opening, wherein the width of the second opening varies according to a plasma ashing time.

In accordance with another aspect of the present invention, there is provided a method for fabricating a semiconductor device, including: forming a drain region inside a substrate; forming a photoresist pattern having a first opening over the substrate; forming a source region inside the substrate exposed to the first opening; partially etching the photoresist pattern by a plasma ashing process using oxygen ($O_2$) gas to form a second opening having a width broader than that of the first opening; and forming a channel region inside the substrate exposed through the second opening; removing the photoresist pattern; forming a gate insulation layer over the substrate; and forming a gate conductive layer over the gate insulation layer, wherein a width of the channel region varies according to a plasma ashing time.

DESCRIPTION OF SPECIFIC EMBODIMENTS

Figure 1A:
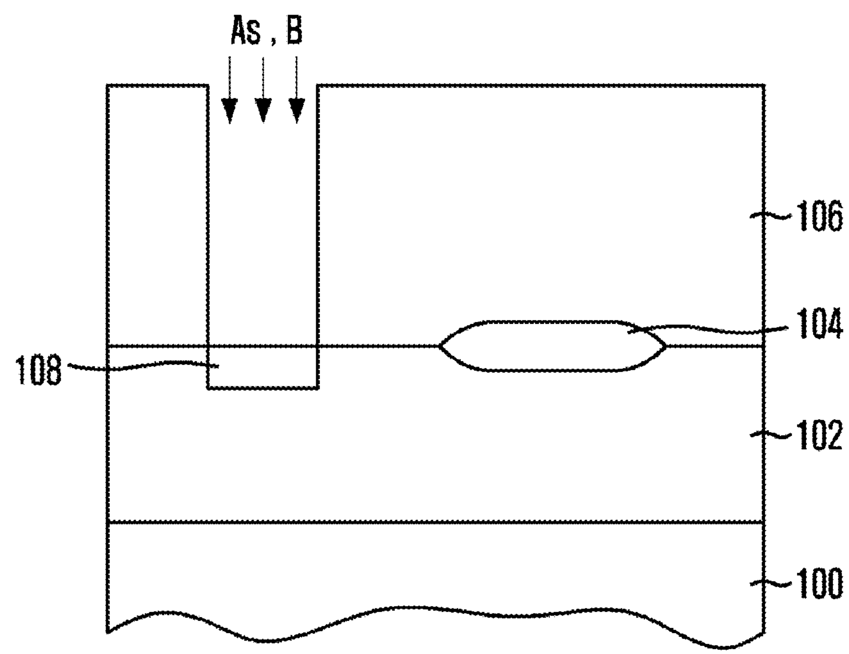
FIGS. 1A to 1C are cross-sectional views describing a conventional lateral double diffused metal-oxide-semiconductor field effect transistor (LDMOS) fabricating method.
Figure 1B:
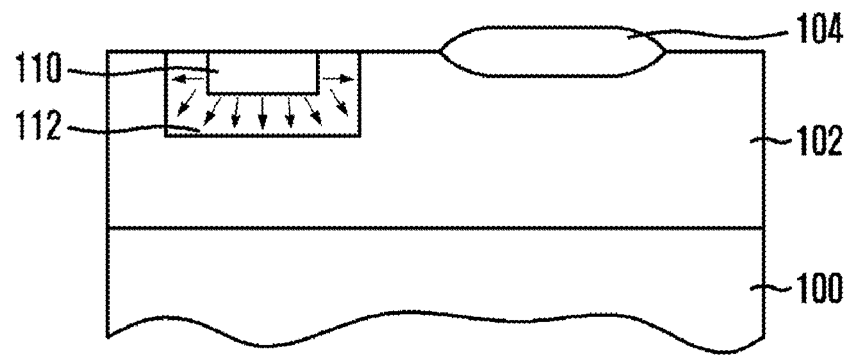
Figure 1C:
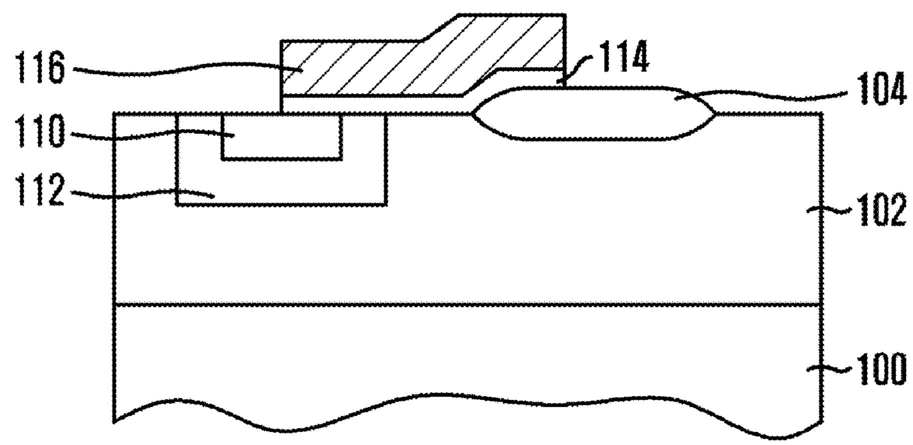

Hereinafter, detailed descriptions on certain embodiments of the present invention will be provided with reference to the accompanying drawings. Herein, thickness of layers and regions may be magnified in the accompanying drawings to clearly show the layers and the regions. Also, when a layer is described to be formed over the other layer or a substrate, either the layer can be directly formed on the other layer or the substrate, or a third layer may be disposed therebetween. Furthermore, the same or like reference numerals denote the same or like constitution elements even in different drawings. When each reference numeral includes English letters, it means that the part of the same layer is transformed by an etching or polishing process.

Figure 2A:
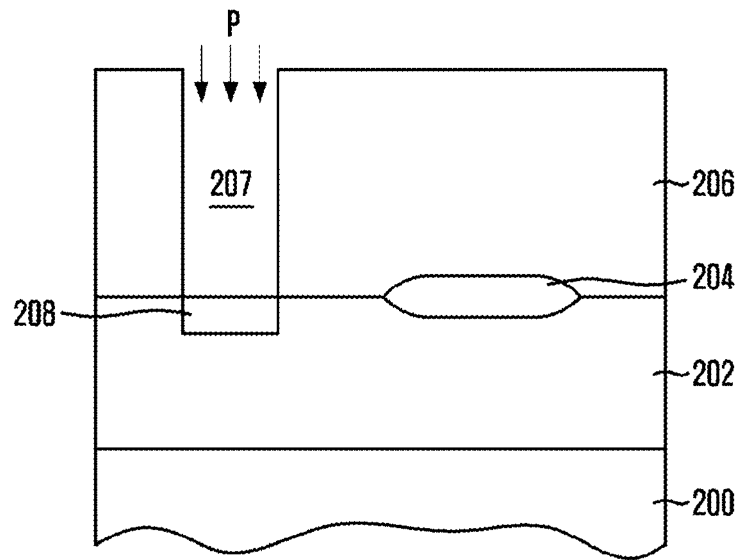
FIGS. 2A to 2C are cross-sectional views showing a method for fabricating a semiconductor device in accordance with an embodiment of the present invention.
Figure 2B:
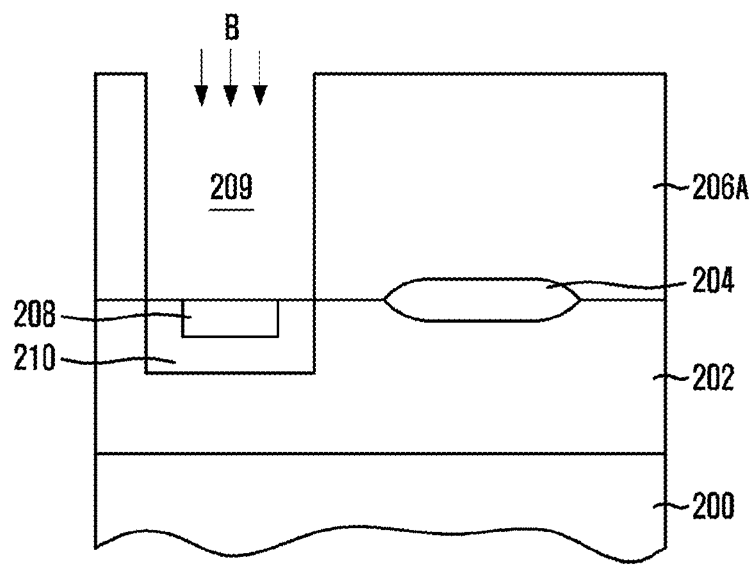
Figure 2C:
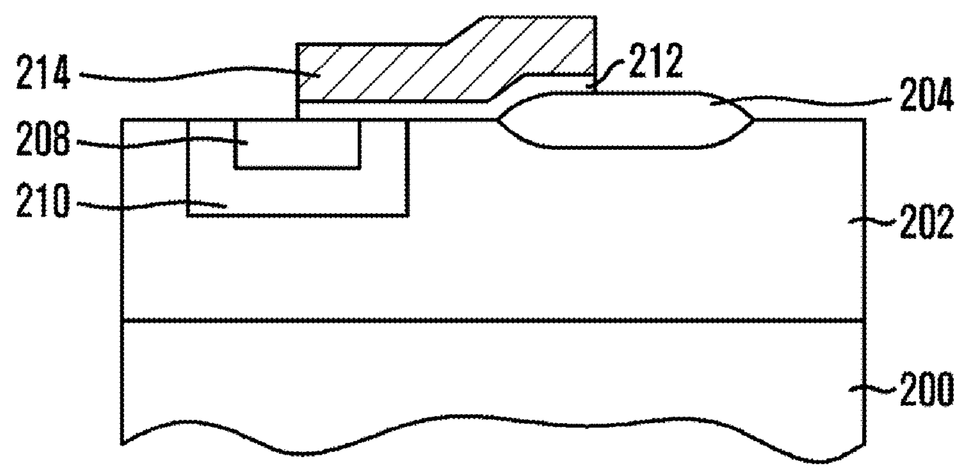

FIGS. 2A to 2C are cross-sectional views showing a method for fabricating a semiconductor device in accordance with an embodiment of the present invention. A fabricating method of a lateral double diffused metal-oxide-semiconductor field effect transistor (LDMOS) having an n-channel will be described as an example.

As shown in FIG. 2A, an n-well 202 having a first conductive type of an n-type is formed over a substrate 200 doped in a second conductive type. At this time, the substrate 200 uses a bulk substrate or a Silicon On Insulator (SOI) substrate. The SOI substrate may be used to improve the characteristic of the device. The SOI substrate includes a supporting member or a supporting substrate, an insulation layer formed on the supporting member, and a semiconductor layer formed on a buried insulation layer. Also, an epitaxial layer may be further formed over the semiconductor layer. At this time, the epitaxial layer grows the semiconductor layer to form a seed layer.

Meanwhile, the n-well 202 functions as a drain region of the LDMOS. Subsequently, a field insulation layer 204 is locally formed over the substrate 200. At this time, the field insulation layer 204 is formed by a LOCal Oxidation of Silicon (LOCOS) process for oxidizing the substrate 200.

A screen oxide layer (not shown) is formed over the substrate 200 including the field insulation layer 204. The screen oxide layer functions as a protection layer for protecting a surface of the substrate 200 in a subsequent ion implantation process.

The screen oxide layer is formed thinly in the oxidizing process. A photoresist pattern 206 having a first opening 207 is formed over the substrate 200. At this time, the photoresist pattern 206 is thicker than a conventional photoresist pattern in consideration of the etching process of FIG. 2B. For example, the thickness of the photoresist pattern 206 ranges from approximately 0.4 μm to approximately 0.6 μm. The thickness of the photoresist pattern 206 may be thicker than approximately 0.5 μm.

A source region 208 is formed as a first impurity region over the substrate 200 exposed to the first opening 207, i.e., inside the n-well 202. At this time, the source region 208 is formed by the ion implantation process.

The impurity of the first conductive type, which is the same conductive type as the n-well 202, is used in the ion implantation process. For example, phosphorus (P) or arsenic (As) is used. Phosphorus (P) may be used instead of arsenic (As), which is hazardous to environment.

As shown in FIG. 2B, a second opening 209 is formed by extending the width of the first opening 207 of the photoresist pattern 206A shown in FIG. 2A. The etching process is performed to form the second opening 209. The etching process is performed by using an plasma ashing chamber. The plasma ashing process is performed using oxygen ($O_2$) gas according to a method for burning the photoresist pattern 206A. Sidewall and top of the photoresist pattern 206A are partially etched by the plasma ashing process using oxygen ($O_2$) gas so that the second opening 209 has a width broader than that of the first opening 207. Also, a width of the second opening 209 which determines a channel length varies by controlling a plasma ashing time. For example, the width of the second opening 209 ranges from approximately 0.1 μm to approximately 0.32 μm. Specifically, the width of the second opening 209 may be 0.2 μm.

Subsequently, a channel region 210 is formed over the substrate 200 exposed to the second opening 209, i.e., inside the n-well 202 as a second impurity region. At this time, the channel region 210 is formed by the ion implantation process same as the process of forming the source region 208. According to the ion implantation process, depth of the channel region 210 is deeper than that of the source region 208 by using the impurity of the second conductive type. The channel region 210 may be aligned around the source region 208 to enclose the source region 208. At this time, boron (B) is used as the impurity of the second conductive type.

Subsequently, a thermal process is performed to activate the impurity respectively implanted to the source region 208 and the channel region 210. At this time, the thermal process may be performed according to an annealing process or a rapid thermal process (RTP).

As shown in FIG. 2C, the photoresist pattern 206A of FIG. 2B is removed. Subsequently, the gate insulation layer 212 is formed over the substrate 200. The substrate 200 is oxidized to form the gate insulation layer 212. The gate insulation layer 212 is formed as a silicon oxide layer. After forming the silicon oxide layer, the gate insulation layer 212 may further include a nitride layer formed over the silicon oxide layer and interface of the substrate 200 by performing the thermal process using nitrogen ($N_2$) gas. There are a dry oxidation process, a wet oxidation process, or an oxidation process using radical ion. It is preferred to use a dry or wet oxidation process rather than to use the oxidation process using radical ion.

Subsequently, a gate conductive layer 214 is formed over the gate insulation layer 212. The gate conductive layer 214 is formed using one selected from the group consisting of a polycrystal silicon film, a transfer metal or a rare earth metal. The gate conductive layer 214 may be formed of a polycrystal silicon film having an excellent interface characteristic with the gate insulation layer 212. Also, iron (Fe), cobalt (Co), tungsten (W), nickel (Ni), palladium (Pd), platinum (Pt), molybdenum (Mo) or titanium (Ti) is used as the transfer metal. As for the rare earth metal, erbium (Er), ytterbium (Yb), samarium (Sm), yttrium (Y), lanthanum (La), cerium (Ce), terbium (Tb), dysprosium (Dy), holmium (Ho), thulium (Tm) or lutetium (Lu) is used.

According to the present invention including the configuration described above, following advantageous effects may be acquired.

First, according to the present invention, in the method for fabricating the semiconductor device including the process for forming two self-aligned impurity regions, the profile of the impurity region is easily controlled by forming two self-aligned impurity regions by the method for controlling the width of the opening of the photoresist pattern through the etching process, which is different from the conventional technology of forming two self-aligned impurity regions by using the impurity having different diffusion forces.

Second, according to the present invention, in the method for fabricating the semiconductor device including the process for forming two self-aligned impurity regions, an operation characteristic of the device is easily controlled by forming two self-aligned impurity regions by the method for controlling the width of the opening of the photoresist pattern through the etching process, which is different from the conventional technology of forming two self-aligned impurity regions by the diffusion process including the thermal process.

That is, since the conventional technology simultaneously realizes the profile of the final impurity region and ion activation by performing the diffusion process, the characteristic of the device is not easily controlled. However, since the present invention controls the profile of the final impurity region by the ion implantation process and controls ion activation by an individual thermal process, the characteristic of the device is easily controlled.

Third, according to the present invention, in the method for fabricating the semiconductor device including the process for forming two self-aligned impurity regions, since the conventional technology uses the impurities having different diffusion forces, impurity selection is limited. However, since the present invention forms the impurity region by the ion implantation process, impurity selection is not limited.

The technical concept of the present invention is described in the above embodiment in detail. The embodiment is not restrictive but descriptive. For example, the technical concept of the present invention is applicable to a structure with breakdown voltage improved by setting a secondary ion implantation process at low concentration when ion concentration gradient is given to improve the breakdown voltage such as Electrostatic Discharge (ESD). Also, the technical concept of the present invention is applicable to devices such as a trench type MOSFET having a common element where a source region and a substrate are self-aligned, a planar type MOSFET, and a Extended Drain MOS (EDMOS). While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:

forming a photoresist pattern having a first opening over a substrate;

forming a first impurity region inside the substrate exposed through the first opening, by ion implantation process of a first conductive type impurity;

partially etching the photoresist pattern by a plasma ashing process using oxygen ($O_2$) gas to form a second opening having a width broader than that of the first opening;

forming a second impurity region inside the substrate exposed through the second opening, by ion implantation process of a second conductive type impurity; and forming a gate electrode over the substrate;

wherein the second conductive type impurity is different from the first conductive type impurity, and the second impurity region is formed to surround a bottom surface and a sidewall of the first impurity region and to be deeper than the first impurity region, wherein the gate electrode is formed to be partially overlapped with the first impurity region.

2. The method of claim 1, wherein the second conductive type impurity is one selected from the group consisting of boron (B), phosphorus (P) and arsenic (As).

3. The method of claim 1, further comprising:

forming a screen oxide layer over the substrate as a protection layer before forming the photoresist pattern.

4. The method of claim 1, further comprising:

performing a thermal treatment after said forming the second impurity region.

5. The method of claim 4, wherein the thermal treatment is an annealing process or a rapid thermal process (RTP).

6. The method of claim 1, further comprising removing the photoresist pattern after forming the second impurity region.

7. The method of claim 1, wherein the first conductive type impurity is n-type and the second conductive type impurity is p-type.

8. A method for fabricating a semiconductor device, comprising:

forming a photoresist pattern having a first opening over a substrate;

forming a first impurity region inside the substrate exposed through the first opening, by ion implantation process of a first conductive type impurity;

partially etching the photoresist pattern by a plasma ashing process using oxygen ($O_2$) gas to form a second opening having a width broader than that of the first opening;

forming a second impurity region inside the substrate exposed through the second opening, by ion implantation process of a second conductive type impurity; and forming a gate electrode over the substrate;

wherein the second conductive type impurity is different from the first conductive type impurity, and the second impurity region is formed to surround a bottom surface and a sidewall of the first impurity region and to be deeper than the first impurity region, wherein the gate electrode is formed to be partially overlapped with the first impurity region the second impurity region.

* * * * *